United States Patent
Ishibashi et al.

(10) Patent No.: US 6,777,253 B2
(45) Date of Patent: Aug. 17, 2004

(54) METHOD FOR FABRICATING SEMICONDUCTOR, METHOD FOR FABRICATING SEMICONDUCTOR SUBSTRATE, AND SEMICONDUCTOR LIGHT EMITTING DEVICE

(75) Inventors: Akihiko Ishibashi, Sakai (JP); Ayumu Tsujimura, Mishima-gun (JP); Yasutoshi Kawaguchi, Neyagawa (JP); Nobuyuki Otsuka, Kawanishi (JP); Kiyoshi Ohnaka, Sakai (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 0 days.

(21) Appl. No.: 10/017,389

(22) Filed: Dec. 18, 2001

(65) Prior Publication Data

US 2002/0079502 A1 Jun. 27, 2002

(30) Foreign Application Priority Data

Dec. 20, 2000 (JP) .................................... 2000-386624

(51) Int. Cl.$^7$ ............................................. H01L 21/00
(52) U.S. Cl. ............................. 438/22; 438/22; 438/31; 438/33; 438/46; 438/479
(58) Field of Search .................... 372/14, 44, 45, 372/50; 257/14

(56) References Cited

U.S. PATENT DOCUMENTS 6,345,063 B1 * 2/2002 Bour et al. .................... 372/45

FOREIGN PATENT DOCUMENTS

JP 10150245 6/1998

OTHER PUBLICATIONS

S. Nakamura et al., "High–Power, Long–Lifetime InGaN/GaN/AlGaN–Based Laser Diodes Grown on Pure GaN Substrates": Japanese Journal of Applied Physics, vol. 37, (1998, pp. L309–L312, Part 2, No. 3B, Mar. 15, 1998.

* cited by examiner

Primary Examiner—David Nelms
Assistant Examiner—Mai-Huong Tran
(74) Attorney, Agent, or Firm—McDermott, Will & Emery (57) ABSTRACT

The method for fabricating a semiconductor includes the steps of: (1) growing a first semiconductor layer made of $Al_xGa_{1-x}N$ ($0 \leq x \leq 1$) on a substrate at a temperature higher than room temperature; and (2) growing a second semiconductor layer made of $Al_uGa_vIn_wN$ ($0 < u \leq 1$, $0 \leq v \leq 1$, $0 \leq w \leq 1$, $u+v+w=1$) over the first semiconductor layer. In the step (1), the mole fraction x of Al of the first semiconductor layer is set so that the lattice constant of the first semiconductor layer at room temperature substantially matches with the lattice constant of the second semiconductor layer in the bulk state after thermal shrinkage or thermal expansion.

11 Claims, 8 Drawing Sheets

METHOD FOR FABRICATING SEMICONDUCTOR, METHOD FOR FABRICATING SEMICONDUCTOR SUBSTRATE, AND SEMICONDUCTOR LIGHT EMITTING DEVICE

BACKGROUND OF THE INVENTION

The present invention relates to a method for fabricating a semiconductor of group III–V nitrides constituting a semiconductor laser device of which application to the optical information processing field and the like is expected, a method for fabricating a semiconductor substrate, and semiconductor light emitting devices fabricated using such methods.

Group III–V nitride semiconductors using nitrogen (N) as a group V element have received attention as promising materials for short-wavelength light emitting devices because they have a comparatively large band gap. Among others, gallium nitride (GaN) based compound semiconductors ($Al_xGa_yIn_zN$ ($0<x \leq 1$, $0 \leq y \leq 1$, $0 \leq z \leq 1$, $x+y+z=1$)) have been studied vigorously, and blue light emitting diode (LED) devices and green LED devices made of GaN-based semiconductors have already been commercialized.

To increase the storage capacity of optical disc devices, semiconductor laser devices having an oscillating wavelength in the 400 nm band are eagerly demanded. In this relation, semiconductor laser devices made of GaN-based compound semiconductors have received attention, and are now about to reach a level of commercialization.

A GaN-based semiconductor laser device has a device structure generally formed by growing crystals on a substrate made of sapphire ($Al_2O_3$ single crystal), silicon carbide (SiC), or the like by metal-organic vapor phase epitaxy (MOVPE).

Figure 8:
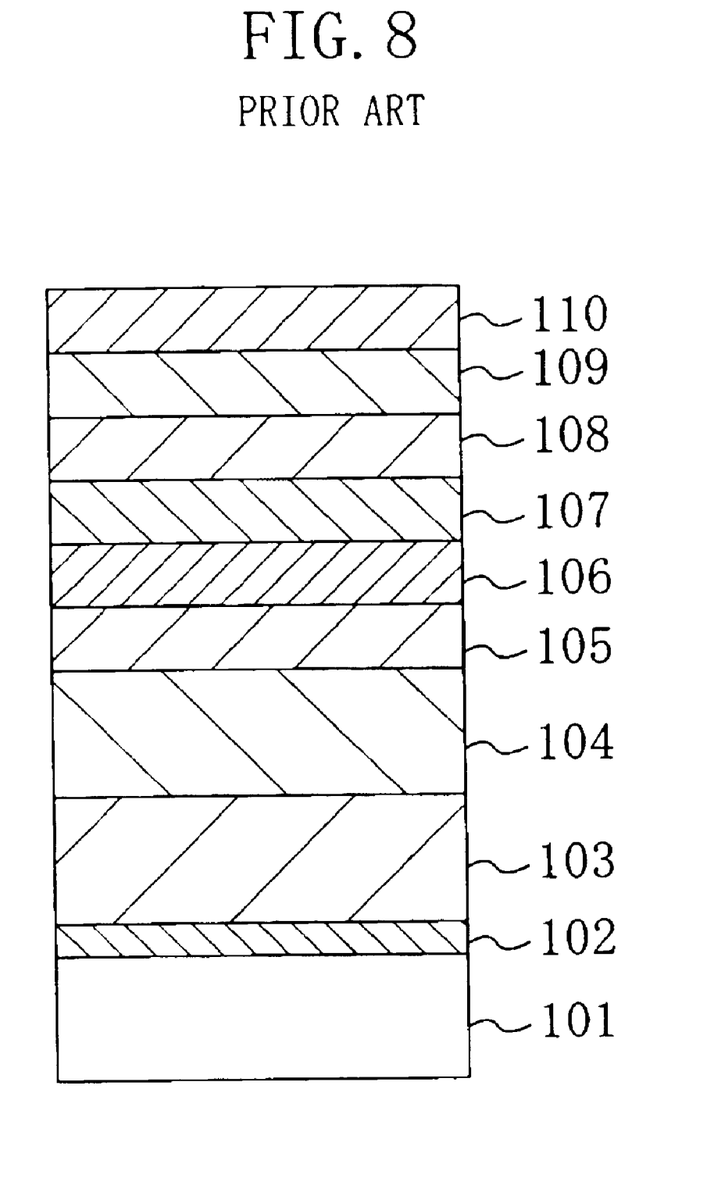
FIG. 8 is a structural cross-sectional view of a conventional semiconductor laser device.

A conventional GaN-based semiconductor laser device will be described with reference to FIG. 8. FIG. 8 shows a cross-sectional construction of a conventional GaN-based semiconductor laser device capable of providing laser oscillation.

As shown in FIG. 8, on a substrate 101 made of sapphire, formed sequentially by crystal growth are a low-temperature growth buffer layer 102, a strain suppression layer 103 made of n-type $Al_{0.05}Ga_{0.95}N$, an n-type cladding layer 104 made of n-type $Al_{0.07}Ga_{0.93}N$, an n-type optical guide layer 105 made of n-type GaN, a multiple quantum well (MQW) active layer 106 made of GaInN, a block layer 107 made of p-type AlGaN, a ptype optical guide layer 108 made of p-type GaN, a P-type cladding layer 109 made of p-type $Al_{0.07}Ga_{0.93}N$, and a p-type contact layer 110 made of p-type GaN.

A feature of the above conventional semiconductor laser device is the strain suppression layer 103 formed on the low-temperature growth buffer layer 102. The strain suppression layer 103 is made of $Al_{0.05}Ga_{0.95}N$. The mole fraction of Al of this composition, 0.05, is determined to be a value close to the Al mole fraction of the n-type cladding layer 104 made of $Al_{0.07}Ga_{0.93}N$, of which the lattice constant is smallest among the plurality of semiconductor layers constituting the laser structure. The strain suppression layer 103 having this composition serves to reduce strain as the underlying layer of the n-type cladding layer 104. Thus, with the existence of the strain suppression layer 103, it is possible to reduce occurrence of cracking in the cladding layer 104 or warping of the substrate 101 that may be caused by crystal strain during the formation of the laser structure.

The n-type and p-type cladding layers 104 and 109 have a thickness of about 0.5 μm, the largest among the layers of the laser structure, and also have the largest Al mole fraction among the layers because they must secure a large band gap and a small refractive index. Therefore, cracking generally tends to occur in the cladding layers.

To overcome the above problem, in the conventional semiconductor laser device, the Al mole fraction of the strain suppression layer 103 is simply determined so that the lattice constant of the strain suppression layer 103 is a value somewhere between the lattice constant of the substrate 101 made of sapphire and that of the cladding layers 104 and 109 made of AlGaN.

Another crystal growth method is also reported where a substrate made of gallium nitride formed by hydride vapor phase epitaxy (H-VPE) or the like is used as the substrate 101 in place of the sapphire substrate.

However, in the above conventional semiconductor growth method, the lattice constants of the strain suppression layer 103 and the cladding layers 104 and 109, which are both made of AlGaN, are not determined by strict designing, but determined by simply setting the Al mole fraction of the strain suppression layer 103 at a value close to that of the cladding layers 104 and 109. Therefore, when the temperature is lowered to room temperature after the crystal growth, the strain suppression layer 103 undergoes strain due to a difference in thermal expansion coefficient between the substrate 101 and the strain suppression layer 103 and therefore changes in lattice constant. As a result, the lattice constant of the strain suppression layer 103 differs from that of the cladding layers 104 and 109, and this causes occurrence of cracking or warping.

In the case of the substrate 101 made of gallium nitride, also, in which the lattice constant is decisively different between the cladding layers and the substrate, cracking or warping occurs in the cladding layers.

SUMMARY OF THE INVENTION

An object of the present invention is to ensure that no cracking or the like occurs particularly in a semiconductor layer having a small lattice constant among a plurality of layered semiconductor layers made of group III–V nitrides.

To attain the above object, in a structure using a substrate made of a material different from a group III–V nitride, the lattice constant of a semiconductor layer having a comparatively small lattice constant among a plurality of semiconductor layers grown on the substrate, that is, a semiconductor layer containing aluminum, is made to substantially match with the lattice constant of a strain suppression layer at room temperature after thermal shrinkage or thermal expansion.

In a structure using a substrate made of a group III–V nitride, the lattice constant of a semiconductor layer having a comparatively small lattice constant among a plurality of semiconductor layers grown on the substrate, that is, a semiconductor layer containing aluminum, is made to substantially match with the lattice constant of the substrate.

The first method for fabricating a semiconductor of the present invention includes the steps of: (1) growing a first semiconductor layer made of $Al_xGa_{1-x}N$ ($0 \leq x \leq 1$) on a substrate at a temperature higher than room temperature; and (2) growing a second semiconductor layer made of $Al_uGa_vIn_wN$ ($0<u \leq 1$, $0 \leq v \leq 1$, $0 \leq w \leq 1$, $u+v+w=1$) over the first semiconductor layer, wherein in the step (1), the mole fraction x of Al of the first semiconductor layer is set so that the lattice constant of the first semiconductor layer at room temperature substantially matches with the lattice constant of the second semiconductor layer in the bulk state after thermal shrinkage or thermal expansion.

According to the first method for fabricating a semiconductor of the present invention, cracking and the like will not occur in the aluminum-containing second semiconductor layer having a comparatively small lattice constant even when the temperature is lowered to room temperature after the growth of the second semiconductor layer.

Preferably, the first method for fabricating a semiconductor further includes the step of growing a third semiconductor layer having an Al mole fraction smaller than the second semiconductor layer between the first semiconductor layer and the second semiconductor layer or over the second semiconductor layer. With this construction, the third semiconductor layer can function as an active layer including a quantum well layer. Thus, the second semiconductor layer having an Al mole fraction larger than the third semiconductor layer can function as a cladding layer.

In the first method for fabricating a semiconductor, the substrate preferably is composed of sapphire, silicon carbide, or silicon. This ensures growth of a semiconductor of a group III–V nitride.

The second method for fabricating a semiconductor of the present invention includes the step of growing a semiconductor layer made of $Al_xGa_yIn_wN$ ($0<u\leq1$, $0\leq v\leq1$, $0\leq w\leq1$, u+v+w=1) over a semiconductor substrate made of $Al_xGa_{1-x}N$ ($0\leq x\leq1$), wherein the lattice constant of the semiconductor substrate is made to substantially match with the lattice constant of the semiconductor layer in the bulk state.

According to the second method for fabricating a semiconductor of the present invention, occurrence of cracking and the like in the semiconductor layer is prevented.

The third method for fabricating a semiconductor of the present invention includes the step of growing a semiconductor layer made of $Al_uGa_vIn_wN$ ($0<u\leq1$, $0\leq v\leq1$, $0\leq w\leq1$, u+v+w=1) over a semiconductor substrate made of $Al_xGa_{1-x}N$ ($0\leq x\leq1$).

In the third method for fabricating a semiconductor, the semiconductor substrate preferably contains indium.

The method for fabricating a semiconductor substrate of the present invention includes the step of forming a semiconductor substrate from $Al_xGa_{1-x}N$ ($0\leq x\leq1$) to be used as a substrate over which a semiconductor layer made of $Al_uGa_vIn_wN$ ($0<u\leq1$, $0\leq v\leq1$, $0\leq w\leq1$, u+v+w=1) is grown, wherein the mole fraction x of Al of the semiconductor substrate is set so that the lattice constant of the semiconductor substrate substantially matches with the lattice constant of the semiconductor layer in the bulk state.

According to the method for fabricating a semiconductor substrate of the present invention, cracking and the like are prevented from occurring in a semiconductor layer grown on the semiconductor substrate.

The first semiconductor light emitting device of the present invention includes: a first semiconductor layer made of $Al_xGa_{1-x}N$ ($0\leq x\leq1$) formed on a substrate; and a second semiconductor layer made of $Al_uGa_vIn_wN$ ($0<u\leq1$, $0\leq v\leq1$, $0\leq w\leq1$, u+v+w=1) formed over the first semiconductor layer, wherein the lattice constant of the first semiconductor layer at room temperature substantially matches with the lattice constant of the second semiconductor layer in the bulk state after thermal shrinkage or thermal expansion.

According to the first semiconductor light emitting device of the present invention, cracking and the like are prevented from occurring in the second semiconductor layer that contains aluminum and thus has a comparatively small lattice constant.

Preferably, the first semiconductor light emitting device further includes an active layer having an Al mole fraction smaller than the second semiconductor layer between the first semiconductor layer and the second semiconductor layer or over the second semiconductor layer, wherein the second semiconductor layer is a cladding layer.

In the first semiconductor light emitting device, the substrate preferably is composed of sapphire, silicon carbide, or silicon.

The second semiconductor light emitting device of the present invention includes: a semiconductor substrate made of $Al_xGa_{1-x}N$ ($0\leq x\leq1$); and a semiconductor layer made of $Al_uGa_vIn_wN$ ($0<u\leq1$, $0\leq v\leq1$, $0\leq w\leq1$, u+v+w=1) formed over the semiconductor substrate, wherein the lattice constant of the semiconductor substrate substantially matches with the lattice constant of the semiconductor layer in the bulk state.

According to the second semiconductor light emitting device of the present invention, occurrence of cracking and the like in the semiconductor layer is prevented.

The third semiconductor light emitting device of the present invention includes: a semiconductor substrate made of $Al_xGa_{1-x}N$ ($0\leq x\leq1$); and a semiconductor layer made of $Al_uGa_vIn_wN$ ($0<u\leq1$, $0\leq v\leq1$, $0\leq w\leq1$, u+v+w=1) formed over the semiconductor substrate.

In the third semiconductor light emitting device, the semiconductor substrate preferably contains indium.

DESCRIPTION OF THE PREFERRED EMBODIMENTS

Hereinafter, preferred embodiments of the present invention will be described with reference to the accompanying drawings.

Embodiment 1

Figure 1:
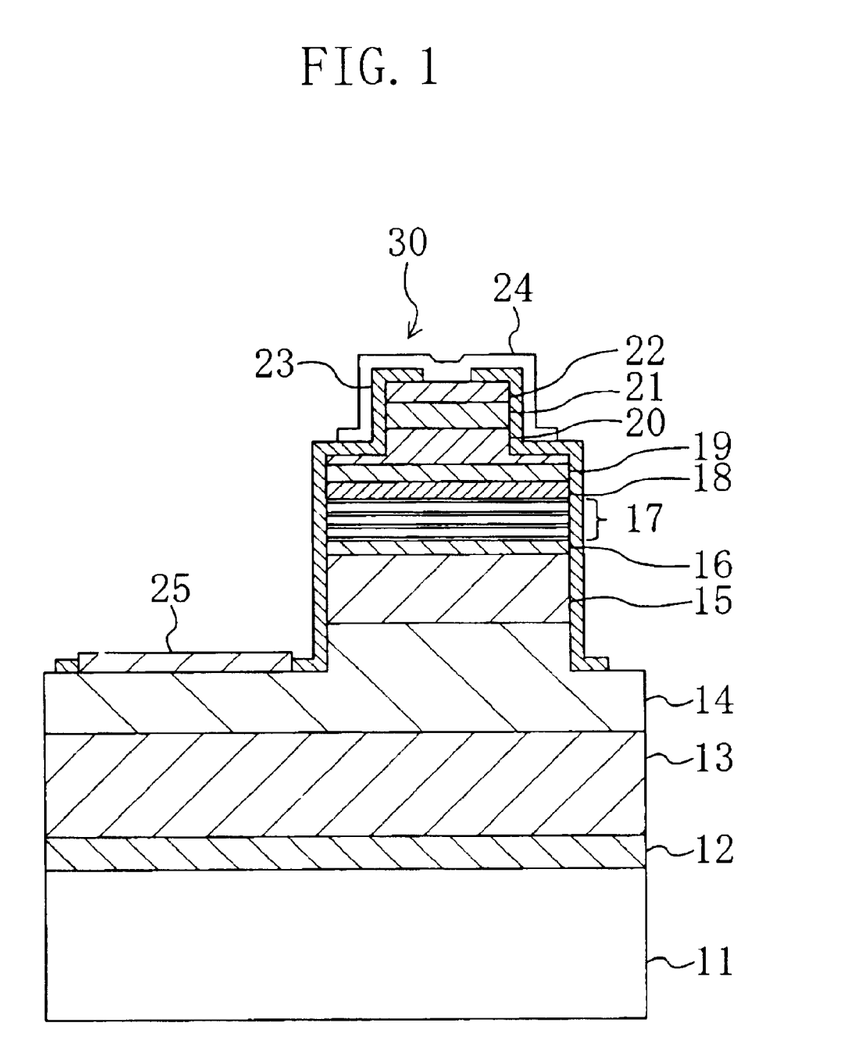
FIG. 1 is a structural cross-sectional view of a semiconductor laser device in Embodiment 1 of the present invention.

FIG. 1 shows a cross-sectional construction of a semiconductor laser device in Embodiment 1 of the present invention.

A method for fabricating a group III–V nitride semiconductor and a semiconductor laser device in Embodiment 1 will be described with reference to FIG. 1. In Embodiment 1, MOVPE is employed as the method for growing a nitride semiconductor. The ambient pressure during the growth of the semiconductor may be the atmospheric pressure (760 Torr; 1 Torr is about 133.322 Pa), a decompressed pressure lower than the atmospheric pressure, or a compressed pressure higher than the atmospheric pressure. Alternatively, each semiconductor layer may be grown under a pressure appropriate for the composition of the layer. As a carrier gas for supplying a material gas to the substrate, used is a gas containing at least an inert gas such as nitrogen or hydrogen.

First, the temperature of a substrate 11 made of sapphire is set at about 500° C., and trimethylgallium (TMG) as a group III source and ammonia ($NH_3$) as a group V source are supplied to the substrate 11, to form a so-called low-temperature buffer layer 12 made of gallium nitride (GaN) having a thickness of about 20 nm on the principal plane of the substrate 11. The low-temperature buffer layer 12 is formed to reduce lattice mismatching between the sapphire and the nitride semiconductor crystal.

The substrate temperature is then raised to about 1100° C., and trimethylaluminum (TMA) is added to the group III source, to grow a strain suppression layer 13 made of AlGaN having a thickness of about 2 µm on the low-temperature buffer layer 12. The mole fraction of Al of the strain suppression layer 13 is 3.5%.

Subsequently, on the strain suppression layer 13, formed sequentially are n-type contact layer 14 made of n-type GaN, an n-type cladding layer 15 made of n-type $Al_{0.07}Ga_{0.93}N$, an n-type optical guide layer 16 made of n-type GaN, a multiple quantum well (MQW) active layer 17 made of a GaInN/GaN multiplayer structure, a p-type cap layer 18 made of p-type $Al_{0.14}Ga_{0.86}N$, a p-type optical guide layer 19 made of p-type GaN, a p-type superlattice cladding layer 20 made of a p-type $Al_{0.14}Ga_{0.86}N$/GaN multilayer structure, a p-type second contact layer 21 made of p-type GaN, and a p-type first contact layer 22 made of p-type GaN having an impurity concentration higher than that of the p-type second contact layer 21 to reduce the resistance.

During the growth of gallium indium nitride (GaInN) constituting well layers of the MQW active layer 17, TMG and trimethylindium (TMI) are supplied as the group III source, and the growth temperature is lowered to about 800° C. to ensure incorporation of indium (In) into the semiconductor layers.

The MQW active layer 17 is constructed of the well layers made of $Ga_{0.9}In_{0.1}N$ each having a thickness of about 3 nm and barrier layers made of GaN each having a thickness of about 6 nm.

The p-type superlattice cladding layer 20 is constructed of a total of 140 cycles of pairs of a barrier layer made of $Al_{0.14}Ga_{0.86}N$ having a thickness of about 2.5 nm and a well layer made of GaN having a thickness of about 2.5 nm. The total thickness of the p-type superlattice cladding layer 20 is therefore about 700 nm. At least the barrier layers or the well layers are doped with magnesium (Mg) as a p-type dopant for the p-type superlattice cladding layer 20.

Thereafter, the resultant epitaxial layers with the ptype first contact layer 22 as the top layer are etched using a mask covering a stripe-shaped resonator formation region so that the n-type contact layer 14 is exposed. Further, the p-type superlattice cladding layer 20, the p-type second contact layer 21, and the p-type first contact layer 22 in the resonator formation region formed by the etching are etched to form a ridge 30 serving as a current injection region in the upper portion of the resonator formation region.

Subsequently, a mask is formed to cover an electrode contact portion of the top surface of the p-type first contact layer 22 and an electrode contact portion of the top surface of the n-type contact layer 14. Under this mask, silicon dioxide ($SiO_2$) is deposited on the ridge 30 and the exposed surface of the resonator formation region by CVD or the like, to form a protection insulating film 23. The stripe width of the ridge 30 is about 3 µm to 5 µm.

A p-side electrode 24 made of a multilayer structure of nickel (Ni) and gold (Au) is then formed by evaporation, for example, to fill the opening of the protection insulating film 23 on the ridge 30 and also cover the p-sides of the ridge 30. An n-side electrode 25 made of a multilayer structure of titanium (Ti) and aluminum (Al) is then formed by evaporation, for example, to fill the opening of the protection insulating film 23 on the n-type contact layer 14.

In the thus-fabricated semiconductor laser device, when a voltage is applied between the p-side electrode 24 and the n-side electrode 25, holes are injected from the p-side electrode 24 while electrons are injected from the n-side electrode 25, toward the MQW active layer 17, resulting in electron-hole recombination at the MQW active layer 17. By this recombination, optical gains are generated and thus laser oscillation at a wavelength of about 406 nm occurs.

Hereinafter, the phenomenon that a GaN semiconductor crystal undergoes compressive strain from the substrate made of sapphire when the temperature is lowered to room temperature after the growth of the crystal will be described.

Figure 2:
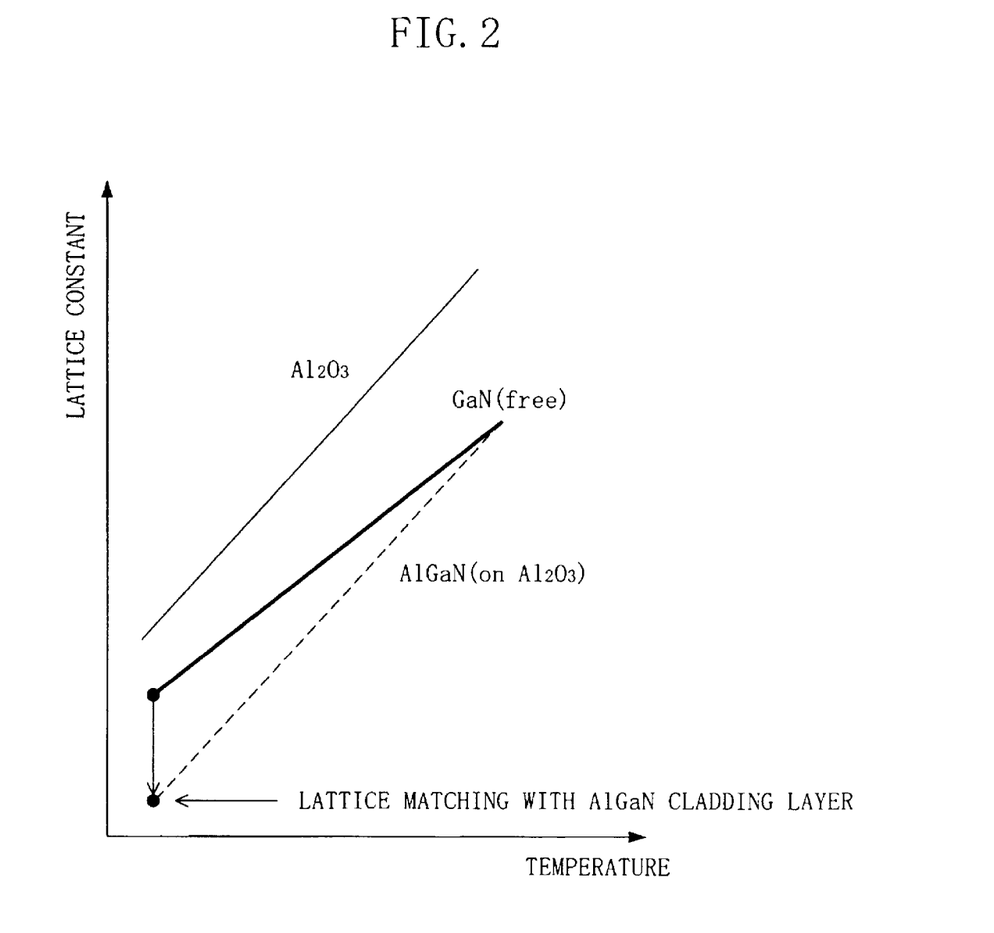
FIG. 2 is a graph showing the relationship between the temperatures of aluminum gallium nitride (AlGaN) grown on sapphire and gallium nitride (GaN) in a free state and the lattice constant of a cladding layer made of aluminum gallium nitride (AlGaN), representing a concept of use of a substrate and a layer of different materials.

FIG. 2 shows the relationship between the temperatures of aluminum gallium nitride (AlGaN) grown on sapphire ($Al_2O_3$) and gallium nitride (GaN) in a free state and the lattice constant of a cladding layer made of aluminum gallium nitride (AlGaN). The x-axis and y-axis of the graph represent the temperature and the lattice constant, respectively.

As shown by the dashed line in FIG. 2, it is known that AlGaN on sapphire undergoes compressive strain in the C plane because the thermal expansion coefficient of sapphire is greater than that of GaN, and for this reason, mainly, the lattice constant in the a-axis direction of AlGaN is reduced. The thermal expansion coefficients of sapphire and GaN are $5.59 \times 10^{-6}$/K and $7.5 \times 10^{-6}$/K, respectively. The AlGaN on sapphire shown by the dashed line corresponds to the strain suppression layer 13 in Embodiment 1.

From various experiments performed by the present inventors, it has been found that the lattice constant of a compressed GaN crystal depends on the conditions under which the GaN-based semiconductor crystal is grown by MOVPE. For example, it has been tracked down that the thickness and crystallinity of the low-temperature buffer layer 12 are delicately influenced by the heating temperature of the substrate, the type of the carrier gas, the pressure during the crystal growth, the flow rate and temperature of the gas, and the like.

Specifically, the substrate made of sapphire is expanded sufficiently when the substrate temperature is raised to as high as about 1100° C. and the temperature of the material gas is set at about 1020° C. during crystal growth. In this case, when the temperature is lowered to room temperature after the crystal growth, the crystal lattice in the a-axis direction of a GaN crystal grown on the substrate is greatly reduced. On the contrary, the thermal expansion of the substrate is small when the substrate temperature is raised to about 1050° C. and the temperature of the material gas is set at about 1020° C. by preheating or the like. In this case, the compressive strain of a GaN crystal grown on the substrate is comparatively small when the temperature is lowered to room temperature after the crystal growth.

The lattice constants in the a-axis direction of gallium nitride (GaN) and aluminum nitride (AlN) are 3.189 Å and 3.112 Å, respectively. Therefore, by adding Al to the GaN crystal, the lattice constant of the resultant AlGaN mixed crystal can be reduced by adjusting the mole fraction of Al of the AlGaN mixed crystal.

It is also found from the experiments by the present inventors that by adjusting the growth conditions, the lattice constant in the a-axis direction of a GaN crystal on sapphire compressed when the temperature is lowered to room temperature can be adjusted within the range corresponding to values of the lattice constant in the bulk state equivalent to the range of 0% to about 10% in terms of the Al mole fraction of an AlGaN mixed crystal. The lattice constant in the bulk state as used herein refers to the inherent lattice constant of the bulk free from heat strain by the substrate.

Naturally, when an AlGaN mixed crystal is grown on the substrate made of sapphire, it also undergoes compressive strain by the substrate, as in the case of the GaN crystal, resulting in reduction in lattice constant in the a-axis direction. Therefore, as in the case of the GaN crystal, by adjusting the growth conditions adopted by MOVPE and the mole fraction of Al, the lattice constant in the a-axis direction of the AlGaN mixed crystal can be made to substantially match with the lattice constant in the a-axis direction of another AlGaN mixed crystal.

From the findings described above, it is found that, in the formation of the GaN-based semiconductor laser device on the substrate 11 made of sapphire, the lattice constant in the a-axis direction of the GaN crystal may be reduced by adjusting the growth conditions adopted by MOVPE, so as to match with the lattice constant in the a-axis direction of the cladding layers 15 and 20 made of AlGaN in the bulk state.

In the case of using silicon carbide (SiC) as the substrate material in place of sapphire, the GaN-based semiconductor crystal grown on SiC undergoes tensile strain when the temperature is lowered to room temperature because the thermal expansion coefficient of SiC is smaller than that of the GaN-based semiconductor.

It is also found that if the temperature of the material gas is reliably controlled at and around 1020° C. during the growth of the GaN crystal on the substrate made of sapphire by MOVPE, the density of cracks generated in the semiconductor crystal having a laser structure formed on the substrate can be dramatically reduced.

Figure 3:
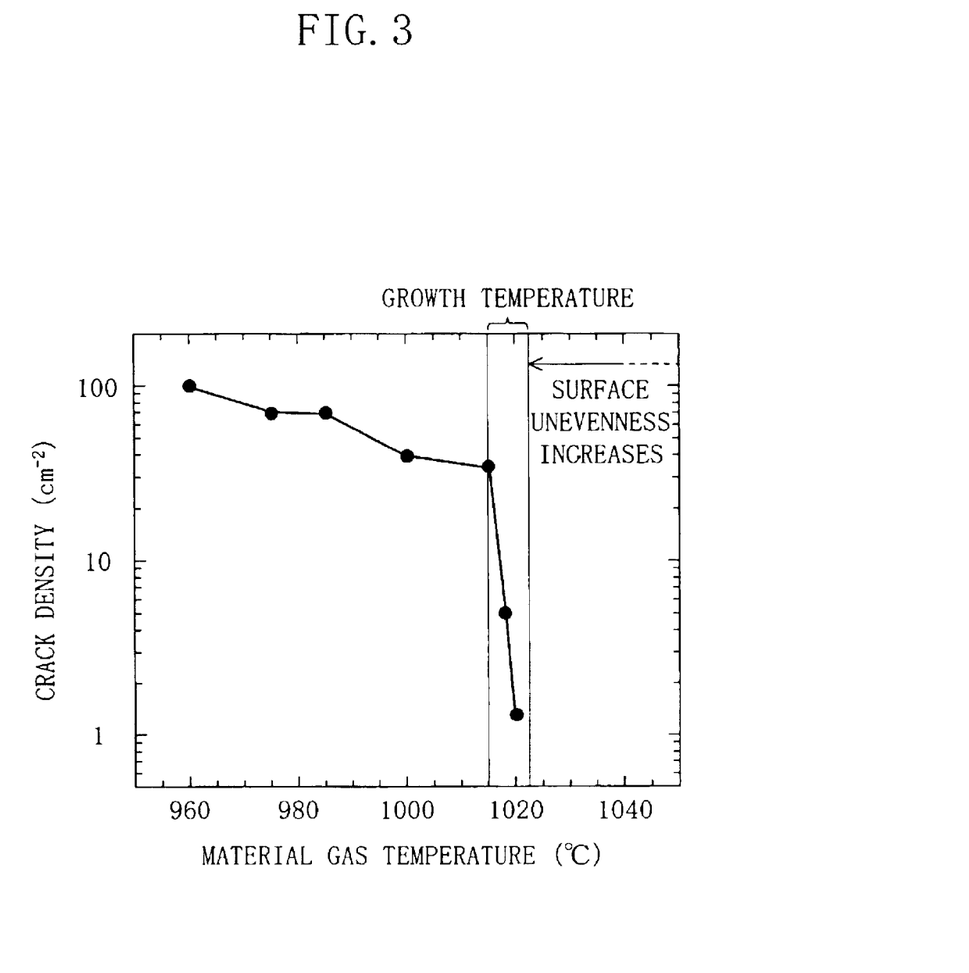
FIG. 3 is a graph showing the relationship between the temperature of a material gas at the start of growth of a semiconductor crystal on a low-temperature buffer layer in a method for fabricating a semiconductor in Embodiment 1 of the present invention and the crack density.

Specifically, FIG. 3 shows the relationship between the temperature of the material gas raised to a predetermined temperature after the growth of the low-temperature buffer layer on the substrate made of sapphire at about 500° C. to be ready for growth of a GaN crystal on the low-temperature buffer layer and the density of cracks generated in the semiconductor crystal having a laser structure. The temperature of the heated material gas as used herein refers to the temperature of the material gas secondarily heated by the heated substrate, not the temperature of the substrate heated by a heater. In other words, the material gas is heated as a result of the heating of the substrate, a susceptor, a gas supply nozzle, and the like that are heated by radiation from the heater. In view of this, the temperature of the material gas can be controlled by adjusting the substrate heating temperature with the heat capacity of the heating mechanism. The temperature of the heated material gas may be measured by placing a thermocouple thermometer downstream of the flow of the supplied material gas with respect to the substrate, for example.

As shown in FIG. 3, the crack density can be significantly reduced by adjusting the temperature of the material gas at and around 1020° C. at the start of the growth of the GaN crystal after the growth of the low-temperature buffer layer. If the temperature is lower than around 1020° C., a number of cracks are generated, and on the contrary, if the temperature is higher than around 1020° C., the surface of the GaN layer becomes uneven with deterioration in flatness although the crack density does not increase. That is, if the temperature is out of around 1020° C., high-quality crystal is not obtained. The GaN crystal in the above description corresponds to the strain suppression layer 13 in Embodiment 1.

The deterioration in the flatness of the crystal surface observed when the temperature of the material gas is higher than around 1020° C. is presumed to occur for the following reason. When the temperature of the material gas is too high and kept rising during the intermission of crystal growth after the growth of the low-temperature buffer layer, the low-temperature buffer layer tends to evaporate and also single-crystallization of the low-temperature buffer layer further develops significantly.

The increase of the crack density observed when the temperature of the material gas is lower than around 1020° C. described above is presumed to occur for the following reason. Under a low temperature, single-crystallization of the low-temperature buffer layer is insufficient. Therefore, presumably, the low-temperature buffer layer originally in an amorphous state fails to be single-crystallized and remains its small grain size. When the GaN crystal is grown on such a low-temperature buffer layer having a small grain size, the level of orientation of the GaN crystal is low. As a result, the GaN crystal fails to undergo compressive strain in the C plane sufficiently when the substrate made of sapphire thermally shrinks.

According to the present invention, an important requirement for suppressing generation of cracks is that the GaN crystal is compressed in the C plane and as a result the compressed GaN crystal lattice-matches with the cladding layer made of AlGaN having a lattice constant smaller than GaN.

Figure 4:
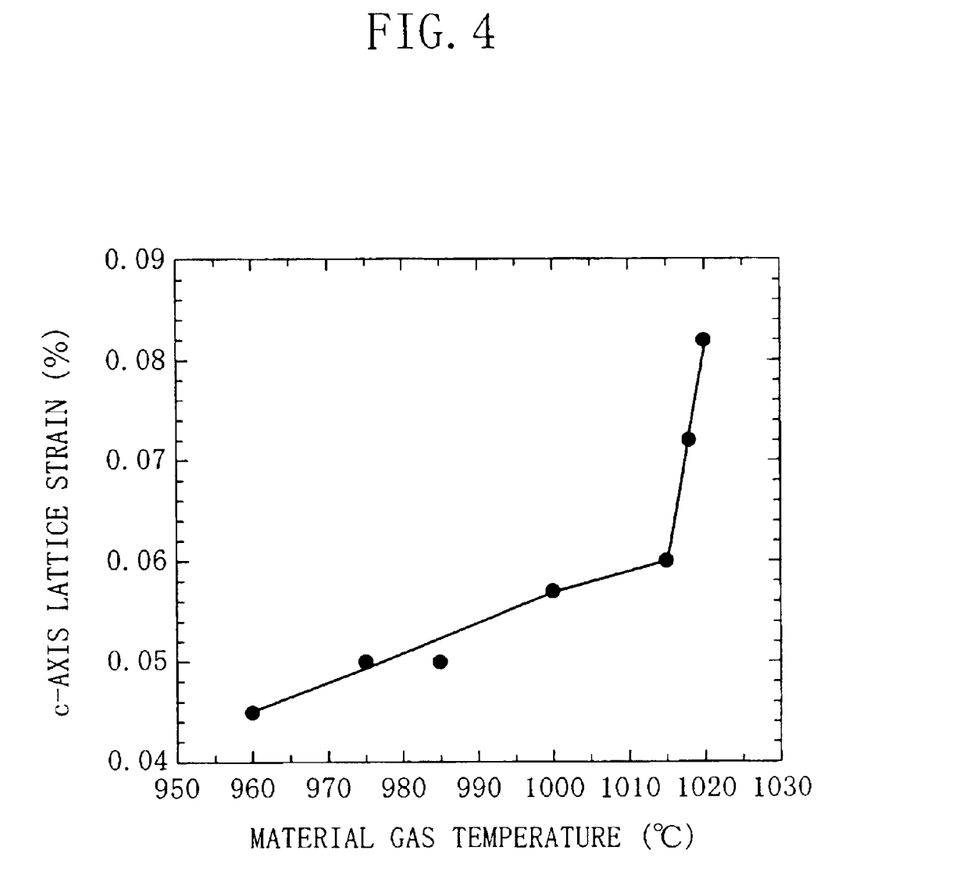
FIG. 4 is a graph showing the relationship between the temperature of a material gas at the start of growth of a semiconductor crystal on a low-temperature buffer layer in the method for fabricating a semiconductor in Embodiment 1 of the present invention and the c-axis lattice strain generated in the semiconductor crystal.

FIG. 4 shows the relationship between the temperature of the material gas raised to a predetermined temperature after the growth of the low-temperature buffer layer on the substrate made of sapphire at about 500° C. to be ready for growth of a GaN crystal on the low-temperature buffer layer and the c-axis lattice strain occurring in the GaN crystal. The GaN crystal in the above description corresponds to the strain suppression layer 13 in Embodiment 1.

From FIG. 4, it is confirmed that compressive strain in the C plane (tensile strain in the c-axis direction) occurs when the temperature of the material gas is at and around 1020° C. It has also been confirmed that this phenomenon also occurs when the low-temperature buffer layer is made of AlGaN and an AlGaN mixed crystal is grown on this low-temperature buffer layer.

The preferred range of the strain (c-axis lattice strain= $(\Delta c/c) \times 100\%$) within which no cracks are generated in the semiconductor crystal having a laser structure is about +0.06% or more. This strain range corresponds to about 5% or more in terms of the Al mole fraction of the cladding layer made of $Al_{0.07}Ga_{0.93}N$.

If the c-axis lattice strain is excessively large, the cladding layer is compressed in the C plane. No upper limit is placed for the compressive strain from the standpoint of suppressing cracks. However, if the compressive strain is excessively large, other problems such as warping of the substrate occur. Essentially, therefore, the strain suppression layer (semiconductor layer on the low-temperature buffer layer) preferably lattice-matches with the cladding layer. Thus, the strain suppression layer made of AlGaN preferably has a lattice constant equivalent to the Al mole fraction in the range of about −2% to about +2% with respect to the Al mole fraction of the cladding layer made of AlGaN.

Based on the findings described above, in Embodiment 1, the lattice constant in the a-axis direction of the strain suppression layer 13 is substantially made to match with the lattice constant in the a-axis direction of the p-type superlattice cladding layer 20. The mole fraction of Al of the strain suppression layer 13 for satisfying the lattice matching condition with the p-type superlattice cladding layer 20 is about 3.5%. As a result, a semiconductor crystal having an even laser structure free from generation of cracks can be formed over the entire surface of the substrate 11 made of sapphire having a diameter of about 5.1 cm (2 inches). This makes it possible to attain a threshold current density for laser oscillation lower than that conventionally obtained. It has been confirmed that the resultant semiconductor laser device provides significantly improved yield.

In Embodiment 1, the n-type contact layer 14 made of n-type GaN is formed on the strain suppression layer 13 to reduce contact resistance at the n-side electrode 25. This n-type contact layer 14 is not necessarily required for the purpose of benefiting the lattice matching conditions described above.

In Embodiment 1, the laser structure made of the group III–V nitride semiconductor layers was formed on the substrate 11 made of sapphire. The substrate 11 is not limited to sapphire as long as crystal growth is performed on the substrate taking advantage of the principle of the lattice matching conditions between the strain suppression layer 13 and the p-type superlattice cladding layer 20 described above.

Specifically, as the substrate 11, silicon carbide (SiC), silicon (Si), or the like may be used, as long as a GaN-based crystal strained due to thermal expansion or thermal shrinkage by the substrate 11 substantially lattice-matches with an AlGaInN cladding layer.

In Embodiment 1, the C plane of the substrate 11 made of sapphire was used. Alternatively, a substrate minutely tilted in a direction of the A plane or the M plane with respect to the C plane may be used as long as the lattice matching conditions described above are substantially satisfied.

The effects of the present invention are also obtainable for all group III–V nitride semiconductors including AlGaInN, boron nitride (BN), and mixed crystals thereof.

In Embodiment 1, the lattice constant of the strain suppression layer 13 made of AlGaN at room temperature was made to substantially match with the lattice constant of the p-type superlattice cladding layer 20 in the bulk state. Alternatively, the lattice constant of the strain suppression layer 13 may be made to substantially match with the lattice constant of a semiconductor layer having a comparatively small lattice constant among the semiconductor layers constituting the laser structure.

Embodiment 2

Figure 5:
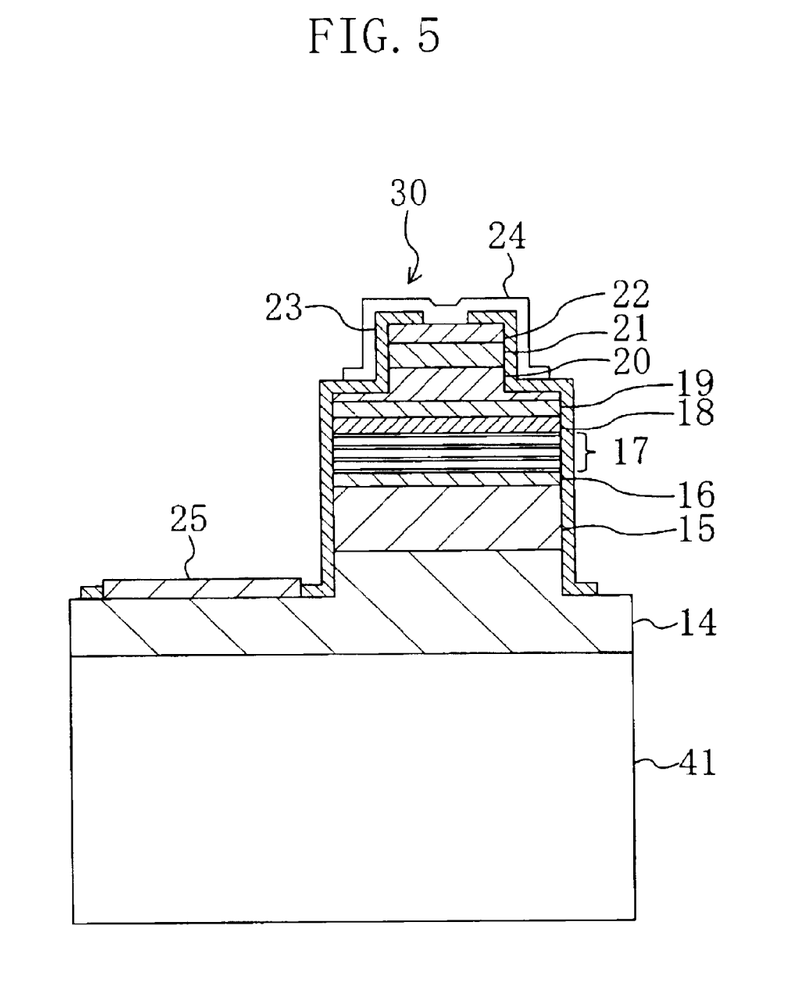
FIG. 5 is a structural cross-sectional view of a semiconductor laser device in Embodiment 2 of the present invention.

FIG. 5 shows a cross-sectional construction of a semiconductor laser device of Embodiment 2 of the present invention.

A method for fabricating a group III–V nitride semiconductor and a semiconductor laser device in Embodiment 2 will be described with reference to FIG. 5. In FIG. 5, the same components as those shown in FIG. 1 are denoted by the same reference numerals, and the description thereof is omitted.

In Embodiment 1 described above, the substrate is made of a material different from the material of the semiconductor layer to be grown thereon. Therefore, to avoid generation of cracks in the semiconductor layer, especially in the cladding layer that is comparatively large both in Al mole fraction and thickness, due to thermal shrinkage or thermal expansion of the substrate when the temperature of the semiconductor layer is lowered to room temperature after the growth, the lattice constant in the a-axis direction of the strain suppression layer underlying the cladding layer is made to substantially match with the lattice constant in the a-axis direction of the cladding layer.

In Embodiment 2, a substrate of the same material as that of the semiconductor layer to be grown thereon is used.

As shown in FIG. 5, a substrate 41 in this embodiment is made of $Al_{0.07}Ga_{0.93}N$, the same composition as that of the n-type cladding layer 15. The method for formation of the substrate 41 will be described in detail in Embodiment 3.

The method for epitaxially growing a nitride semiconductor on the substrate 41 and the method for forming a laser structure will be described.

First, the substrate 41 is put in a reaction chamber of a MOVPE apparatus. Inside the chamber, the temperature of the substrate 41 is raised to about 1120° C., and thermal cleaning of the substrate 41 is performed in an atmosphere containing ammonia, hydrogen, and nitrogen for about 10 minutes, to remove a surface oxide film on the substrate 41.

If gallium nitride is used for the substrate as used conventionally, the substrate will thermally decompose by the thermal cleaning at as high as 1120° C. However, if thermal cleaning is performed at a low temperature, sufficient cleaning effect will not be obtainable.

In Embodiment 2, the substrate 41 contains aluminum that exhibits a large binding force with nitrogen. Therefore, the substrate 41 is prevented from decomposing even at a high temperature exceeding 1100° C. As a result, the surface oxide film can be removed from the substrate 41 reliably, and thus a sufficiently cleaned principle plane of the substrate 41 is provided.

The substrate temperature is then lowered to about 1020° C. in the same atmosphere containing ammonia, hydrogen, and nitrogen. Once the substrate temperature is substantially stabilized, supply of TMG as a group III source is started, to form the n-type contact layer 14 made of n-type GaN on the principal plane of the substrate 41. On the n-type contact layer 14, the n-type cladding layer 15 and the subsequent layers are formed sequentially as in Embodiment 1 until the p-type first contact layer 22 is formed.

Thereafter, the resonator formation region, the ridge 30, the p-side electrode 24, and the n-side electrode 25 are formed as in Embodiment 1.

In this embodiment, gallium nitride (GaN) was used as the material of the n-type contact layer 14. Alternatively, aluminum gallium nitride (AlGaN) may be used. Note however that the maximum mole fraction of Al of the n-type contact layer 14 is preferably up to the mole fraction of Al of the n-type cladding layer 15.**

As described above, in Embodiment 2, the substrate 41 on which group III–V nitride semiconductor layers are grown contains Al in a mole fraction that enables the substrate 41 to substantially lattice-match with the n-type cladding layer 15 made of n-type $Al_{0.07}Ga_{0.93}N$. No cracks are therefore generated in the semiconductor layer grown on the substrate

41. This makes it possible to attain a semiconductor (wafer) for formation of a laser device made of a group III–V nitride semiconductor.

In Embodiment 2, since the substrate 41 is not made of a material different from a group III–V nitride semiconductor, such as sapphire or silicon carbide, the influence of the thermal expansion of the substrate 41 on the nitride semiconductor is very small. Therefore, naturally, the mole fraction of Al of the substrate 41 is preferably set so that the lattice constant of the substrate 41 substantially matches with that of the n-type cladding layer 15. Note however that the effect of suppressing generation of cracks is sufficiently obtained by adding only a slight amount of aluminum (Al) to gallium nitride (GaN).

In Embodiment 2, the composition of the substrate 41 is not necessarily set so that the lattice constant of the substrate 41 matches with or is close to the lattice constant of the cladding layer 15 made of aluminum gallium nitride (AlGaN).

In other words, the composition of the substrate 41 is not limited to the AlGaN described above, but the mole fraction of Al may be changed, or another element or the like may be added to the substrate 41 depending on the composition or the materials of a mixed crystal of the cladding layer constituting the laser structure or a semiconductor layer having a comparatively small lattice constant among the epitaxial layers constituting the laser structure or a function device.

Indium (In) may be added to the substrate 41 because addition of In reduces loss of injection carriers.

Modification of Embodiment 2

Figure 6:
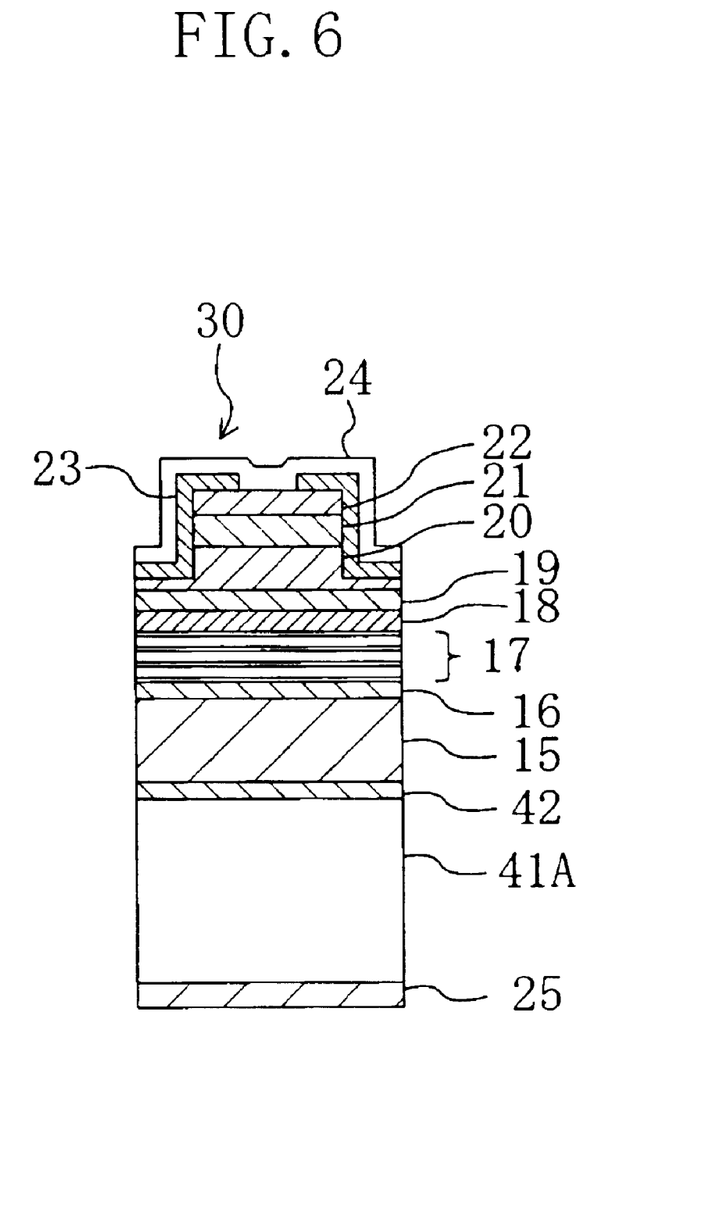
FIG. 6 is a structural cross-sectional view of a semiconductor laser device in a modification of Embodiment 2 of the present invention.

FIG. 6 shows a semiconductor laser device of a modification of Embodiment 2 of the present invention. In FIG. 6, the same components as those shown in FIG. 5 are denoted by the same reference numerals, and the description thereof is omitted.

A substrate 41A made of $Al_{0.07}Ga_{0.93}N$ in this modification has an n-type conductivity, for example. As the n-type dopant, silicon (Si) or oxygen (0) is used. The lattice constant in the a-axis direction of the substrate 41A more or less changes with the doping. Therefore, the mole fraction of Al of the substrate 41A is adjusted so that the lattice constant of the substrate 41A substantially matches with the lattice constant in the a-axis direction of the n-type cladding layer 15.

As shown in FIG. 6, the n-side electrode 25 is placed on the back surface of the substrate 41A because the substrate 41A has conductivity. Therefore, with no n-side electrode formed between the substrate 41A and the n-type cladding layer 15 made of $Al_{0.07}Ga_{0.93}N$, an n-type semiconductor layer 42 made of n-type AlGaN is formed in place of the contact layer 14 made of n-type GaN provided in Embodiment 2. In this construction, therefore, the p-side electrode 24 placed on the ridge 30 and the n-side electrode 25 oppose to each other.

In Embodiments 1 and 2, the nitride semiconductor was grown by MOVPE. Alternatively, other methods for growing a III–V nitride semiconductor, such as hydride vapor phase epitaxy (H-VPE) and molecular beam epitaxy (MBE), may be employed.

Embodiment 3

Figure 7:
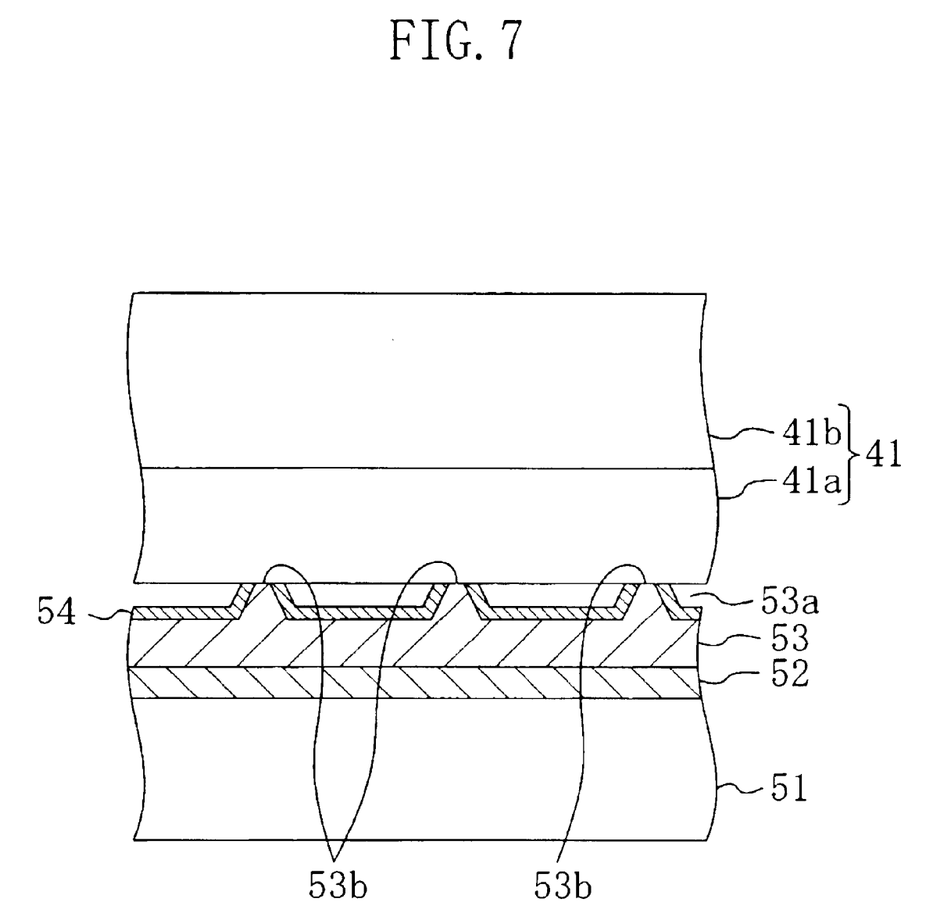
FIG. 7 is a partial structural cross-sectional view showing a method for fabricating a semiconductor substrate in Embodiment 3 of the present invention.

FIG. 7 is a partial structural cross-sectional view of a semiconductor substrate made of a group III–V nitride used for growing a group III–V nitride semiconductor thereon in Embodiment 3 of the present invention.

Referring to FIG. 7, a method for fabricating the semiconductor substrate made of a group III–V nitride in Embodiment 3 will be described.

First, with the growth temperature set at about 500° C., $NH_3$ as a group V source and TMG as a group III source are supplied to the principal plane of a base substrate 51 made of sapphire, for example, to grow a low-temperature buffer layer 52 made of GaN having a thickness of about 20 nm on the base substrate 51.

Subsequently, after the growth temperature is raised to about 1020° C., TMA is added to the group III source, to grow an underlying layer 53 made of AlGaN having a thickness of about 1 μm on the low-temperature buffer layer 52. A resist pattern (not shown) is then formed on the underlying layer 53 by photolithography. The resist pattern is composed of stripes having a width of about 3 μm extending in parallel with each other with a spacing of about 12 μm between the adjacent stripes. Using the resist pattern as a mask, the underlying layer 53 is dry-etched, to form a plurality of recesses 53a and a plurality of stripe-shaped convex portions 53b between the adjacent recesses 53a in the upper portion of the underlying layer 53.

Silicon nitride ($SiN_x$) is then deposited over the entire surface of the underlying layer 53 with the recesses 53a, including the resist pattern and the convex portions 53b, by ECR sputtering, for example, to form a mask film 54. The portions of the mask film 54 located on the convex portions 53b are then removed by lifting off the resist pattern, to expose the top faces of the convex portions 53b.

Thereafter, with the growth temperature set at about 1000° C., $NH_3$, TMG, and TMA are supplied to the underlying layer 53, to grow a selective growth layer 41a made of $Al_{0.07}Ga_{0.93}N$ having a thickness of about 2 μm by MOVPE again, using the exposed faces of the convex portions 53b of the underlying layer 53 as seed crystal. Subsequently, a substrate body layer 41b made of $Al_{0.07}Ga_{0.93}N$ having a thickness of about 2 to 200 μm is grown on the selective growth layer 41a. In this way, a semiconductor substrate 41 composed of the selective growth layer 41a and the substrate body layer 41b is attained. The semiconductor substrate 41 may be peeled off from the underlying layer 53 and the base substrate 51. Peeling-off of the semiconductor substrate 41 is easy because the semiconductor substrate 41 is in contact with only the convex portions 53b of the underlying layer 53. Wherein, if the semiconductor substrate 41 is peeled off, the substrate body layer 41b is set to 200 μm in thickness. In this case, because the growth rate in the MOVPE method is small, a H-VPE method at about several decades μm/h growth rate may be used in combination.

The selective growth method described above using the top faces of the convex portions 53b of the underlying layer 53 exposed on the mask film 54 as the seed crystal is called Air Bridged Lateral Epitaxial Growth (ABLEG) (trade name of Matsushita Electric Industrial Co., Ltd.)

As described above, in Embodiment 3, it is possible to attain the semiconductor substrate 41 made of aluminum gallium nitride (AlGaN) with high quality free from occurrence of lattice defect, cracking, and warping.

When an AlGaN ternary mixed crystal is selectively grown from the exposed faces of the underlying layer on the mask film, aluminum as the element is deposited on the mask film 54. However, in Embodiment 3 employing the ABLEG method, gaps are formed between the underlying layer 53 and the selective growth layer 41a with the existence of the recesses 53a. As a result, deposited aluminum is prevented from entering the selective growth layer 41a, and thus the crystal quality of the semiconductor substrate 41 significantly improves.

The method for formation of the nitride semiconductor substrate made of a ternary mixed crystal is not limited to the ABLEG method. A nitride semiconductor substrate may be formed by growing a nitride semiconductor on a base substrate made of sapphire, gallium arsenide (GaAs), silicon (Si), silicon carbide (SiC), or the like by MOVPE or H-VPE to a thickness of several hundred micrometers and then peeling off from the base substrate. In this case, an epitaxial lateral overgrowth (ELO) method may be combined.

Alternatively, the nitride semiconductor substrate may be formed of a bulk substrate directly grown in a high-pressure nitrogen or ammonia atmosphere.

What is claimed is:

1. A method for fabricating a semiconductor, comprising the steps of:

(1) growing a first semiconductor layer made of $Al_xGa_{1-x}N$ ($0 \leq x \leq 1$) on a substrate at a temperature higher than room temperature; and (2) growing a second semiconductor layer made of $Al_uGa_vIn_wN$ ($0 < u \leq 1$, $0 \leq v \leq 1$, $0 \leq w \leq 1$, $u+v+w=1$) over the first semiconductor layer, wherein in the step (1), the mole fraction x of Al of the first semiconductor layer is set so that the lattice constant of the first semiconductor layer at room temperature substantially matches with the lattice constant of the second semiconductor layer in the bulk state after thermal shrinkage or thermal expansion.

2. The method of claim 1, further comprising the step of growing a third semiconductor layer having an Al mole fraction smaller than the second semiconductor layer between the first semiconductor layer and the second semiconductor layer or over the second semiconductor layer.

3. The method of claim 1, wherein the substrate is composed of sapphire, silicon carbide, or silicon.

4. The method of claim 1, wherein the first semiconductor layer is formed by supplying a material gas heated to a temperature of around 1020° C.

5. A method for fabricating a semiconductor, comprising the step of:

growing a semiconductor layer made of $Al_uGa_vIn_wN$ ($0<u \leq 1$, $0 \leq v \leq 1$, $0 \leq w \leq 1$, $u+v+w=1$) over a semiconductor substrate made of $Al_xGa_{1-x}N$ ($0 \leq x \leq 1$), wherein the lattice constant of the semiconductor substrate is made to substantially match with the lattice constant of the semiconductor layer in the bulk state.

6. The method of claim 5, wherein the semiconductor layer is formed by supplying a material gas heated to a temperature of around 1020° C.

7. A method for fabricating a semiconductor, comprising the step of:

growing a semiconductor layer made of $Al_uGa_vIn_wN$ ($0<u \leq 1$, $0 \leq v \leq 1$, $0 \leq w \leq 1$, $u+v+w=1$) over a semiconductor substrate made of $Al_xGa_{1-x}N$ ($0 \leq x \leq 1$).

8. The method of claim 7, wherein the semiconductor substrate contains indium.

9. The method of claim 7, wherein the semiconductor layer is formed by supplying a material gas heated to a temperature of around 1020° C.

10. A method for fabricating a semiconductor substrate, comprising the step of forming a semiconductor substrate from $Al_xGa_{1-x}N$ ($0 \leq x \leq 1$) to be used as a substrate over which a semiconductor layer made of $Al_uGa_vIn_wN$ ($0<u \leq 1$, $0 \leq v \leq 1$, $0 \leq w \leq 1$, $u+v+w=1$) is grown, wherein the mole fraction x of Al of the semiconductor substrate is set so that the lattice constant of the semiconductor substrate substantially matches with the lattice constant of the semiconductor layer in the bulk state.

11. The method of claim 10, wherein the semiconductor layer is formed by supplying a material gas heated to a temperature of around 1020° C.

* * * * *